(12) United States Patent
Yoshimura

(10) Patent No.: US 10,459,469 B2
(45) Date of Patent: Oct. 29, 2019

(54) CONSTANT-VOLTAGE GENERATING APPARATUS AND MEASURING APPARATUS

(71) Applicant: FUJI ELECTRIC CO., LTD., Kanagawa (JP)

(72) Inventor: Hiroyuki Yoshimura, Yokohama (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 74 days.

(21) Appl. No.: 15/719,596

(22) Filed: Sep. 29, 2017

(65) Prior Publication Data

US 2018/0129235 A1 May 10, 2018

(30) Foreign Application Priority Data

Nov. 9, 2016 (JP) ................................ 2016-218801

(51) Int. Cl.
| | | |
|---|---|---|
| G05F 1/575 | (2006.01) | |
| H02J 1/04 | (2006.01) | |
| G05F 1/46 | (2006.01) | |
| H03K 19/003 | (2006.01) | |

(52) U.S. Cl.
CPC .............. *G05F 1/575* (2013.01); *G05F 1/468* (2013.01); *H02J 1/04* (2013.01); *H03K 19/003* (2013.01)

(58) Field of Classification Search
CPC ........ G05F 1/575; G05F 1/468; H03K 19/003
USPC .......................................................... 307/33
See application file for complete search history.

(56) References Cited

U.S. PATENT DOCUMENTS

| | | | |
|---|---|---|---|
| 2002/0145600 A1 | 10/2002 | Morita | |
| 2004/0227093 A1* | 11/2004 | Klassen | .................... G01T 1/17 250/370.01 |
| 2011/0199003 A1* | 8/2011 | Muguruma | ........ H05B 33/0824 315/122 |
| 2012/0049901 A1 | 3/2012 | Takewaki et al. | |

FOREIGN PATENT DOCUMENTS

| | | |
|---|---|---|
| JP | S61-126807 A | 6/1986 |
| JP | S62-055958 A | 3/1987 |
| JP | 2006-087238 A | 3/2006 |
| JP | 2006-350425 A | 12/2006 |
| JP | 2012060694 A | 3/2012 |
| JP | 2013-085272 A | 5/2013 |

OTHER PUBLICATIONS

Extended European Search Report issued for counterpart European Patent Application No. 17 192 928.4, issued by he European Patent Office dated Mar. 29, 2018.

* cited by examiner

*Primary Examiner* — Carlos Amaya

(57) ABSTRACT

A constant-voltage generating apparatus including a plurality of constant-voltage circuits connected in series is provided. Each of the constant-voltage circuits has a positive-side power supply node, a negative-side power supply node, and a control unit that controls voltage between the positive-side power supply node and the negative-side power supply node to be constant voltage. The positive-side power supply node in the constant-voltage circuit at a preceding stage is connected to the negative-side power supply node in the constant-voltage circuit at a subsequent stage. The constant-voltage generating apparatus may further include a constant-current circuit that regulates power-supply currents flowing through the plurality of constant-voltage circuits to be constant.

10 Claims, 7 Drawing Sheets

CONSTANT-VOLTAGE GENERATING APPARATUS AND MEASURING APPARATUS

The contents of the following Japanese patent application(s) are incorporated herein by reference:
2016-218801 filed in JP on Nov. 9, 2016

BACKGROUND

1. Technical Field

The present invention relates to constant-voltage generating apparatuses and measuring apparatuses.

2. Related Art

It is known that radiations having entered a semiconductor element such as a transistor affect operation of the semiconductor element (for example, see Patent Document 1). Also, constant-voltage generating apparatuses using semiconductor elements are known.

Patent Document 1: Japanese Patent Application Publication No. 2013-85272

In environment in which there may be radiations more intensive than the natural radiation, such as a nuclear power plant, output voltage of a constant-voltage generating apparatus drifts in some cases.

SUMMARY

A first aspect of the present invention provides a constant-voltage generating apparatus including a plurality of constant-voltage circuits connected in series. Each of the constant-voltage circuits may have a positive-side power supply node, a negative-side power supply node, and a control unit that controls voltage between the positive-side power supply node and the negative-side power supply node to be constant voltage. The positive-side power supply node in a constant-voltage circuit at a preceding stage may be connected to the negative-side power supply node in a constant-voltage circuit at a subsequent stage.

The constant-voltage generating apparatus may include a constant-current circuit that regulates power-supply current flowing through the plurality of constant-voltage circuits to be constant. Each of the constant-voltage circuits may have a smoothing capacitor provided between the positive-side power supply node and the negative-side power supply node.

The constant-voltage generating apparatus may include a shared capacitor provided between the positive-side power supply node in the constant-voltage circuit provided at the last stage and the negative-side power supply node in the constant-voltage circuit provided at the first stage.

Each of the constant-voltage circuits may have two or more voltage dividing resistors provided in series between the positive-side power supply node and the negative-side power supply node. A voltage dividing resistor in the constant-voltage circuit at the preceding stage and a voltage dividing resistor in the constant-voltage circuit at the subsequent stage may be connected in series.

The control unit may have a reference voltage generating unit that generates a reference voltage. The control unit may have a current path that is provided between the positive-side power supply node and the negative-side power supply node, and in parallel with the voltage dividing resistors. The control unit may have a current amount adjusting unit that controls the amount of current flowing through the current path based on a result of comparison between voltage divided by the voltage dividing resistors and the reference voltage.

Each of the control units may control its corresponding constant-voltage circuit such that the voltage between the positive-side power supply node and the negative-side power supply node in the corresponding circuit becomes approximately equal to that in any one of the other constant-voltage circuits. Each of the control units may control its corresponding constant-voltage circuit such that the voltage between the positive-side power supply node and the negative-side power supply node in the corresponding constant-voltage circuit becomes different from the voltage between the positive-side power supply node and the negative-side power supply node in any one of other constant-voltage circuits.

Each of the constant-voltage circuits may have 1% or less fluctuation of the voltage between the positive-side power supply node and the negative-side power supply node when exposed to a γ-ray atmosphere so as to have a radiation dose of 2 kGy or more.

A second aspect of the present invention provides a measuring apparatus that includes the constant-voltage generating apparatus of the first aspect and measures physical quantities in facilities in radiation environment. The measuring apparatus may have a two-wire type circuit in which a conversion unit, a DC power supply, and a load resistor are connected in a loop.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1A:
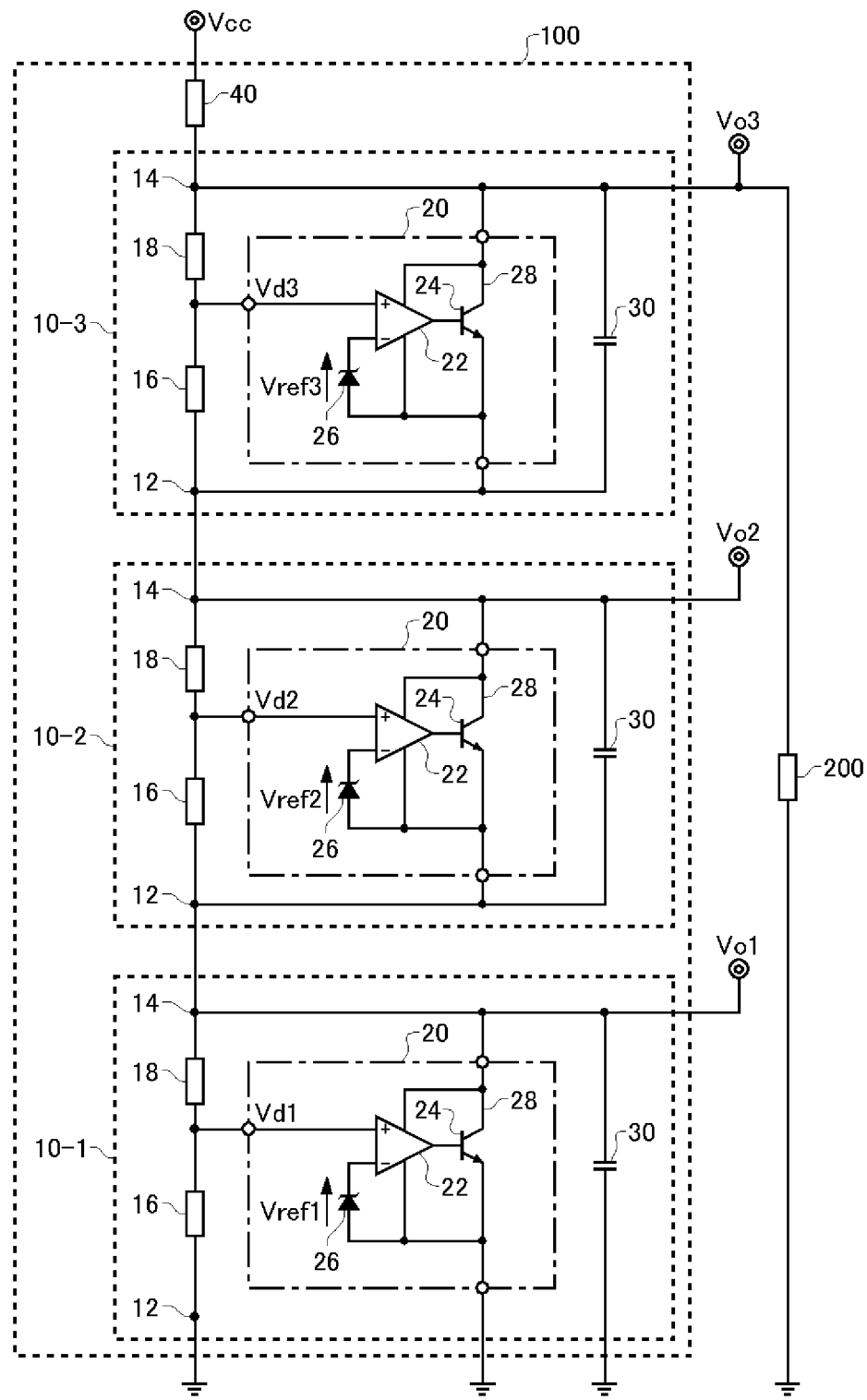
FIG. 1A is a circuit diagram showing an exemplary constant-voltage generating apparatus 100 together with a load 200 according to an embodiment of the present invention.

FIG. 1A is a circuit diagram showing an exemplary constant-voltage generating apparatus 100 together with a load 200 according to an embodiment of the present invention. The constant-voltage generating apparatus 100 applies a predetermined constant voltage to the load 200. The load 200 is a measuring circuit that measures a predetermined physical quantity, for example, but examples of the load 200 are not limited thereto.

The constant-voltage generating apparatus 100 is used at facilities in the radiation environment. The radiation environment refers to environments in which there may be radiations more intensive than the natural radiation. The facilities in the radiation environment are where radioactive materials are used, for example, and more specifically are nuclear power plants or the like. Also, the facilities in the radiation environment may also be facilities in the space.

The constant-voltage generating apparatus 100 includes a plurality of constant-voltage circuits 10 connected in series. With the plurality of constant-voltage circuits 10 connected in series, the constant-voltage generating apparatus 100 of the present example suppresses fluctuation of output voltage that can be caused by the influence of radiations. The constant-voltage generating apparatus 100 shown in FIG. 1A includes a first constant-voltage circuit 10-1, a second constant-voltage circuit 10-2, and a third constant-voltage circuit 10-3 connected in series between a predetermined positive power supply terminal (the terminal to which a predetermined positive power supply voltage Vcc is applied in the present example) and a predetermined negative power supply terminal (the terminal that is connected to the ground potential in the present example).

Each of the constant-voltage circuits 10 includes a positive-side power supply node 14, a negative-side power supply node 12, and a control unit 20. The control unit 20 controls the voltage between the positive-side power supply node 14 and the negative-side power supply node 12 to be constant voltage. In the present example, the voltage at the positive-side power supply node 14 is referred to as an output voltage Vo.

Each of the constant-voltage circuits 10 has a semiconductor element such as a transistor. For example, each of the control units 20 has a semiconductor element. The characteristic of at least one of the semiconductor elements included in the constant-voltage circuits 10 fluctuates due to entry of radiations. The semiconductor element may be configured with a FET or a bipolar transistor.

The constant-voltage circuits 10 being connected in series refers to a state that the positive-side power supply node 14 in the constant-voltage circuit 10 at a preceding stage is connected to the negative-side power supply node 12 in the constant-voltage circuit 10 at a subsequent stage. Note that the constant-voltage circuit 10 on the negative power supply terminal side of the constant-voltage generating apparatus 100 is referred to as the preceding stage while the constant-voltage circuit 10 on the positive power supply terminal side is referred to as the subsequent stage. In the present example, a current restricting resistor 40 is provided between the positive power supply terminal Vcc and the positive-side power supply node 14 in the constant-voltage circuit 10-3 at the last stage. The current restricting resistor 40 restricts power-supply current flowing through the constant-voltage generating apparatus 100. The current restricting resistor 40 may also be provided outside the constant-voltage generating apparatus 100.

The output voltage Vo at the constant-voltage circuit 10 at the last stage is applied to the load 200. The constant-voltage circuit 10 at the last stage refers to the constant-voltage circuit 10 closest to the positive power supply terminal, and is the third constant-voltage circuit 10-3 in the present example.

In the constant-voltage generating apparatus 100 of the present example, the plurality of constant-voltage circuits 10 are connected in series to generate a constant voltage Vo3 to be applied to the load 200. Therefore, the voltage between the positive-side power supply node 14 and the negative-side power supply node 12 in the individual constant-voltage circuit 10 can be made lower than the constant voltage Vo3 that is to be applied to the load 200.

If radiations enter the semiconductor element, pairs of electrons and holes are generated by ionization effect. Electrons and holes drift through the semiconductor due to an electric field. If electric charge due to the electrons or the holes having drifted is accumulated in a predetermined region of the semiconductor element, the characteristic of the semiconductor element fluctuates. For example, if electric charge is accumulated in a depletion layer or in a gate-insulating film of a FET, the threshold voltage of the FET drifts or the insulating film gets destroyed.

If the electrons or the holes generated by the ionization effect annihilate due to recombination and the like before they reach a predetermined region in the semiconductor element, the accumulation of electric charge in the region is suppressed. Electrons or holes travel at a speed corresponding to the intensity of the electric field. Thus, if a high voltage is applied between electrodes of the semiconductor element, electric charge that reaches the region increases, thereby making electric charge prone to be accumulated.

The voltage applied between the electrodes in the semiconductor element depends on the voltage between the positive-side power supply node 14 and the negative-side power supply node 12 in the constant-voltage generating apparatus 100. Therefore, the characteristic of the semiconductor element becomes prone to change if the voltage between the positive-side power supply node 14 and the negative-side power supply node 12 is high. If the characteristic of the semiconductor element included in the control unit 20 changes, output voltage of the constant-voltage generating apparatus 100 drifts.

In contrast, in the constant-voltage generating apparatus 100, the plurality of constant-voltage circuits 10 are connected in series, so that the voltage between the positive-side power supply node 14 and the negative-side power supply node 12 in the individual constant-voltage circuit 10 can be lowered. Therefore, changes in the characteristic of the semiconductor element can be suppressed even if radiations enter the semiconductor element. Accordingly, the fluctuation of the voltage output by the constant-voltage generating apparatus 100 can be suppressed.

The constant-voltage circuit 10 of the present example has two or more voltage dividing resistors provided in series between the positive-side power supply node 14 and the negative-side power supply node 12. In the example shown in FIG. 1A, each of the constant-voltage circuits 10 has a voltage dividing resistor 16 and a voltage dividing resistor 18. The voltage dividing resistor 16 and the voltage dividing resistor 18 generate a voltage Vd by dividing the voltage between the positive-side power supply node 14 and the negative-side power supply node 12 at a resistance ratio. Note that the voltage dividing resistors (16, 18) in the constant-voltage circuit 10 at the preceding stage and the voltage dividing resistors (16, 18) in the constant-voltage circuit 10 at the subsequent stage are connected in series.

Based on the divided voltage Vd, the control unit 20 controls the voltage between the positive-side power supply node 14 and the negative-side power supply node 12 to be constant voltage. As one example, the control unit 20 controls current flowing through a current path 28 provided between the positive-side power supply node 14 and the negative-side power supply node 12 corresponding to the voltage Vd, thereby controlling the voltage between the positive-side power supply node 14 and the negative-side power supply node 12 to be constant voltage.

The control unit 20 of the present example has a reference voltage generating unit 26, a current amount adjusting unit 22, the current path 28, and a transistor 24. The reference voltage generating unit 26 generates a reference voltage Vref. The reference voltage Vref is set corresponding to output voltage to be generated by the constant-voltage circuit 10. The reference voltage generating unit 26 of the present example has a Zener diode. The reference voltage generating unit 26 uses backward voltage of the Zener diode as the reference voltage Vref.

The current path 28 is provided between the positive-side power supply node 14 and the negative-side power supply node 12 and in parallel with the voltage dividing resistors (16, 18). The transistor 24 is provided in the current path 28 and adjusts the amount of current flowing through the current path 28 corresponding to voltage to be applied to the base terminal. The transistor 24 in the present example is a bipolar transistor but may be a FET or the like.

The current amount adjusting unit 22 controls the amount of current flowing through the current path 28, based on the result of comparison between the voltage Vd divided by the voltage dividing resistors (16, 18) and the reference voltage Vref. The current amount adjusting unit 22 of the present example applies voltage corresponding to the difference between the divided voltage Vd and the reference voltage Vref, to the base terminal of the transistor 24. The current amount adjusting unit 22 may be a differential amplifier that receives drive voltage from the positive-side power supply node 14 and the negative-side power supply node 12 and outputs voltage corresponding to the difference between the divided voltage Vd and the reference voltage Vref. The current amount adjusting unit 22 may include a semiconductor element the characteristic of which can change due to entry of radiations. Voltage corresponding to the voltage between the positive-side power supply node 14 and the negative-side power supply node 12 is applied to the semiconductor element. In the present example, the plurality of constant-voltage circuits 10 are connected in series, so that voltage to be applied to the semiconductor element included in the current amount adjusting unit 22 can be lowered.

With this configuration, the control unit 20 controls the voltage between the positive-side power supply node 14 and the negative-side power supply node 12 to be constant. The control unit 20 and the voltage dividing resistors (16, 18) of the present example function as shunt regulators, but the configuration of the constant-voltage circuit 10 is not limit thereto.

Also, each of the constant-voltage circuits 10 may further include a smoothing capacitor 30 provided between the positive-side power supply node 14 and the negative-side power supply node 12. In the present example, the constant-voltage circuits 10 are connected in series. Thus, if oscillation or the like is generated in an output voltage Vo of any one of the constant-voltage circuits 10, it also affects output voltages Vo of the other constant-voltage circuits 10. By providing the smoothing capacitor 30 in each of the constant-voltage circuits 10, the output voltage Vo of each of the constant-voltage circuits 10 can be stabilized, and thereby the operation of the entire constant-voltage generating apparatus 100 can be easily stabilized. Note that in FIG. 1A, the smoothing capacitor 30 and the current path 28 in the constant-voltage circuit 10-1 at the first stage are connected to the ground potential, and this connection to the ground potential is equivalent to the connection to the negative-side power supply node 12.

Figure 1B:
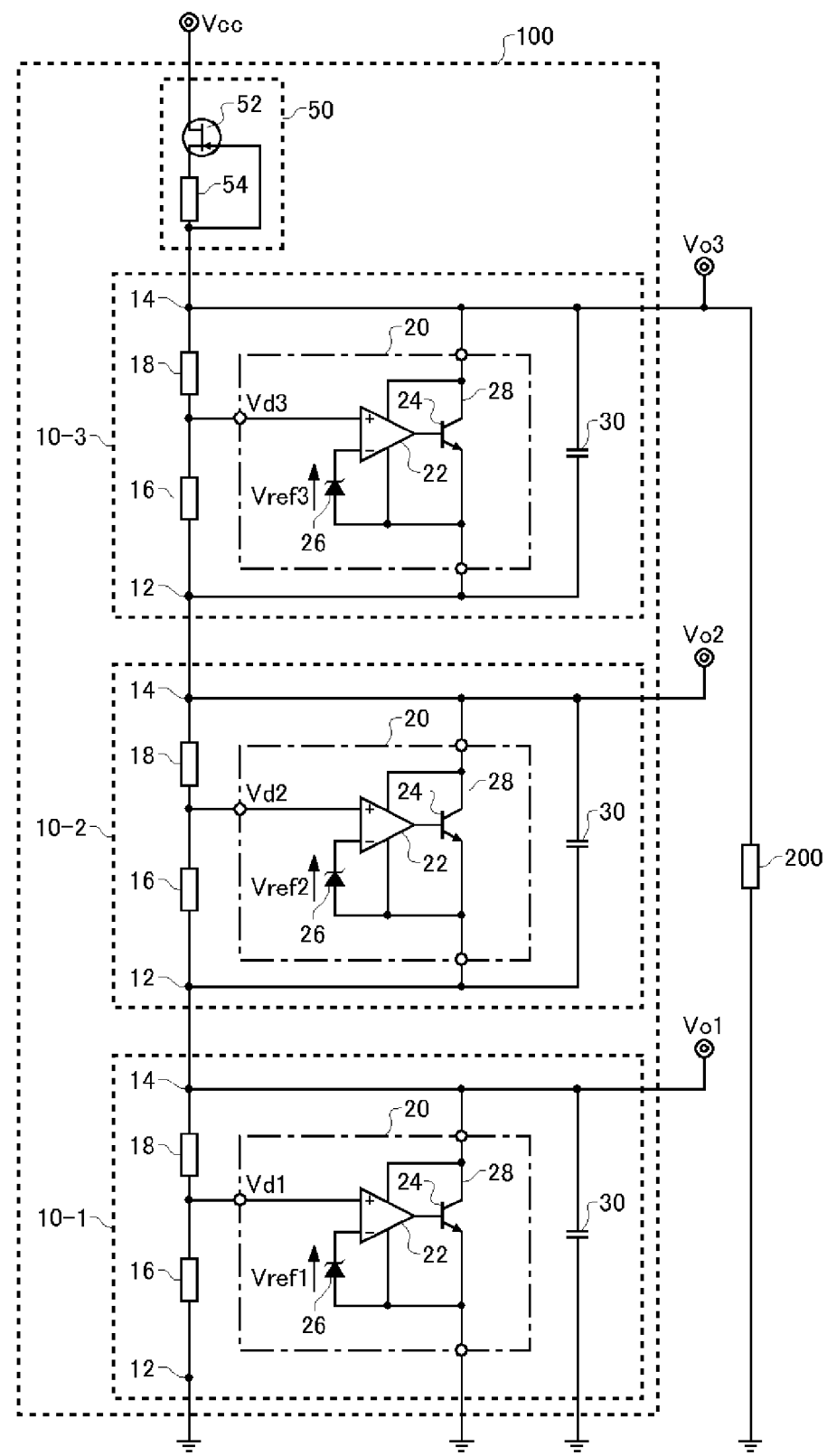
FIG. 1B is a diagram showing another exemplary constant-voltage generating apparatus 100.

FIG. 1B is a diagram showing another exemplary constant-voltage generating apparatus 100. Except that a constant-current circuit 50 is provided instead of the current restricting resistor 40 in the constant-voltage generating apparatus 100 shown in FIG. 1A, the configuration of the constant-voltage generating apparatus 100 of the present example is the same as that of the constant-voltage generating apparatus 100 shown in FIG. 1A. The constant-current circuit 50 may also be provided outside the constant-voltage generating apparatus 100.

The constant-current circuit 50 is provided between the positive-side power supply node 14 in the constant-voltage circuit 10-3 at the last stage and the positive power supply terminal Vcc. The constant-current circuit 50 regulates the amount of current flowing from the positive power supply terminal Vcc to the positive-side power supply node 14 to be constant and power-supply current flowing through the plurality of constant-voltage circuits 10 to be constant.

The constant-current circuit 50 of the present example has a junction type FET 52 and a resistor 54. A drain terminal of the junction type FET 52 is connected to the positive power supply terminal Vcc, and a source terminal is connected via the resistor 54 to the positive-side power supply node 14 in the constant-voltage circuit 10-3 at the last stage. Also, a gate terminal of the junction type FET 52 is connected to the positive-side power supply node 14 in the constant-voltage circuit 10-3 at the last stage, and voltage drop across the resistor 54 works as a gate-source voltage Vgs. Because of this, drain current through the junction type FET 52 can be maintained constant.

If drain current in the junction type FET 52 increases, voltage drop across the resistor 54 increases. Because of this, gate-source voltage in the junction type FET 52 fluctuates, which decreases drain current. By such an operation, the constant-current circuit 50 can control drain current to be constant.

Depending on the application of the constant-voltage generating apparatus 100, current consumption of the constant-voltage generating apparatus 100 is required to maintain constant in some cases even if voltage of an external power supply fluctuates. By providing the constant-current circuit 50, the consumption of current flowing into the constant-voltage generating apparatus 100 from the external power supply can be maintained constant even if the external power supply voltage Vcc fluctuates.

Figure 2:
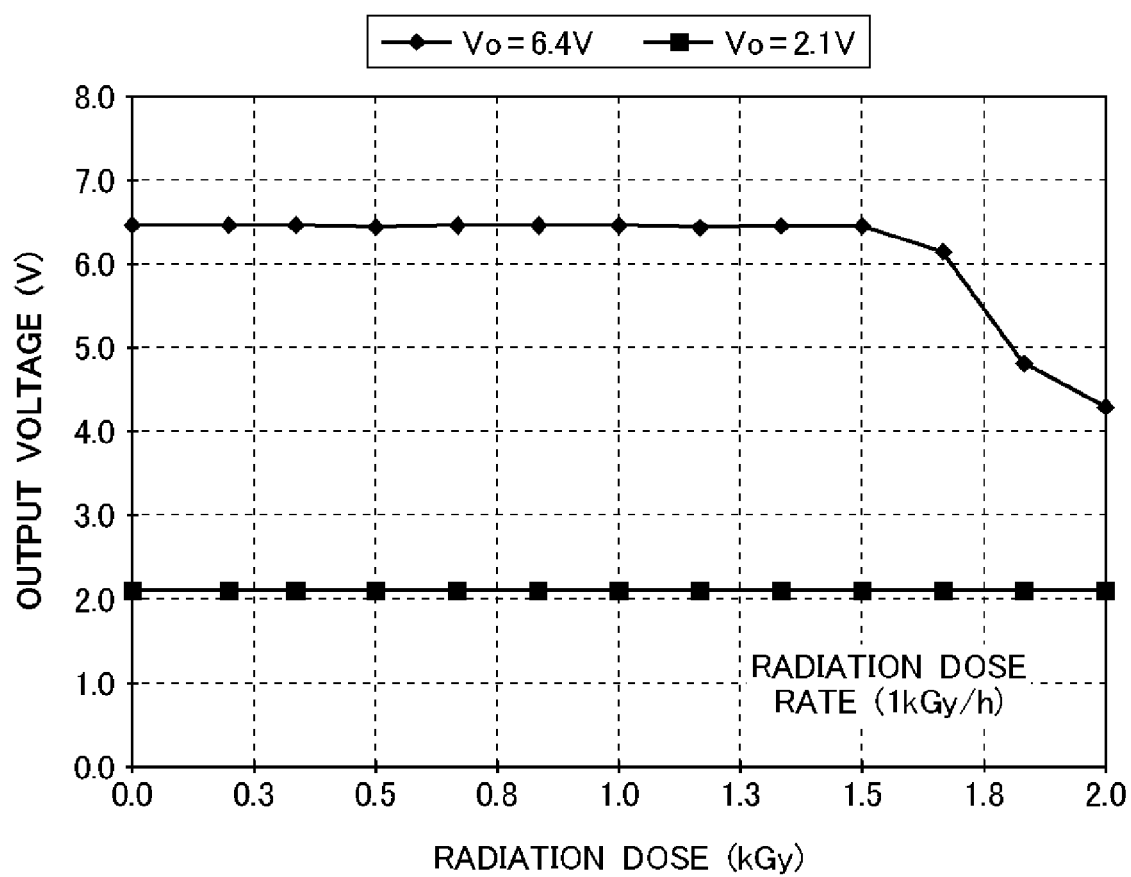
FIG. 2 is a graph describing an exemplary operation of one constant-voltage circuit 10 in a case where a desired voltage is generated with the constant-voltage circuit 10.

FIG. 2 is a graph describing an exemplary operation of a single constant-voltage circuit 10. FIG. 2 shows fluctuations of the output voltage Vo relative to radiation dose when the constant-voltage circuit 10 is exposed to the γ-ray atmosphere at a 1 kGy/h radiation dose rate. The present example describes operations of two types of the constant-voltage circuits 10 in which the output voltages Vo of the constant-voltage circuits 10 (i.e., the voltages between the positive-side power supply nodes 14 and the negative-side power supply nodes 12) are set to be different. The setting of the output voltage Vo can be adjusted by the resistance ratio of the voltage dividing resistor, the reference voltage, or the like. In the present example, the output voltage Vo of one of the constant-voltage circuits 10 is 6.4 V, and the output voltage of the other constant-voltage circuit 10 is 2.1 V.

In the constant-voltage circuit 10 in which the output voltage Vo is set to be 6.4 V, the output voltage Vo greatly fluctuates around a region where the radiation dose exceeds 1.7 kGy. In contrast, in the constant-voltage circuit 10 in which the output voltage Vo is set to be 2.1 V, the output voltage does not fluctuate even if the radiation dose increases. Note that even if the radiation dose exceeds the range shown in FIG. 2 to become 2 kGy or more, the fluctuation of the output voltage of the constant-voltage circuit 10 in which the output voltage Vo is set to be 2.1 V is 1% or less. Furthermore, even if the radiation dose increases up to 50 kGy, the fluctuation is 1% or less.

As described above, in the constant-voltage circuit 10 in which the output voltage Vo is set to be 6.4 V, a high electric field is applied to the semiconductor element included in the constant-voltage circuit 10. Therefore, electrons or holes generated in response to entry of radiations are prone to reach a predetermined region of the depletion layer, the gate-insulating film, or the like, so that electric charge is prone to be accumulated in the region. Therefore, if the radiation dose exceeds a certain level, the characteristic of the semiconductor element fluctuates.

In contrast, in the constant-voltage circuit 10 in which the output voltage Vo is set to be 2.1 V, the electric field to be applied to the semiconductor element is weak, so that it becomes more difficult for the electrons or the holes generated in response to entry of radiations to reach the predetermined region of the depletion layer, the gate-insulating film, or the like. Therefore, accumulation of electric charge in the region is suppressed, so that the fluctuation of the characteristic of the semiconductor element is suppressed.

Figure 3:
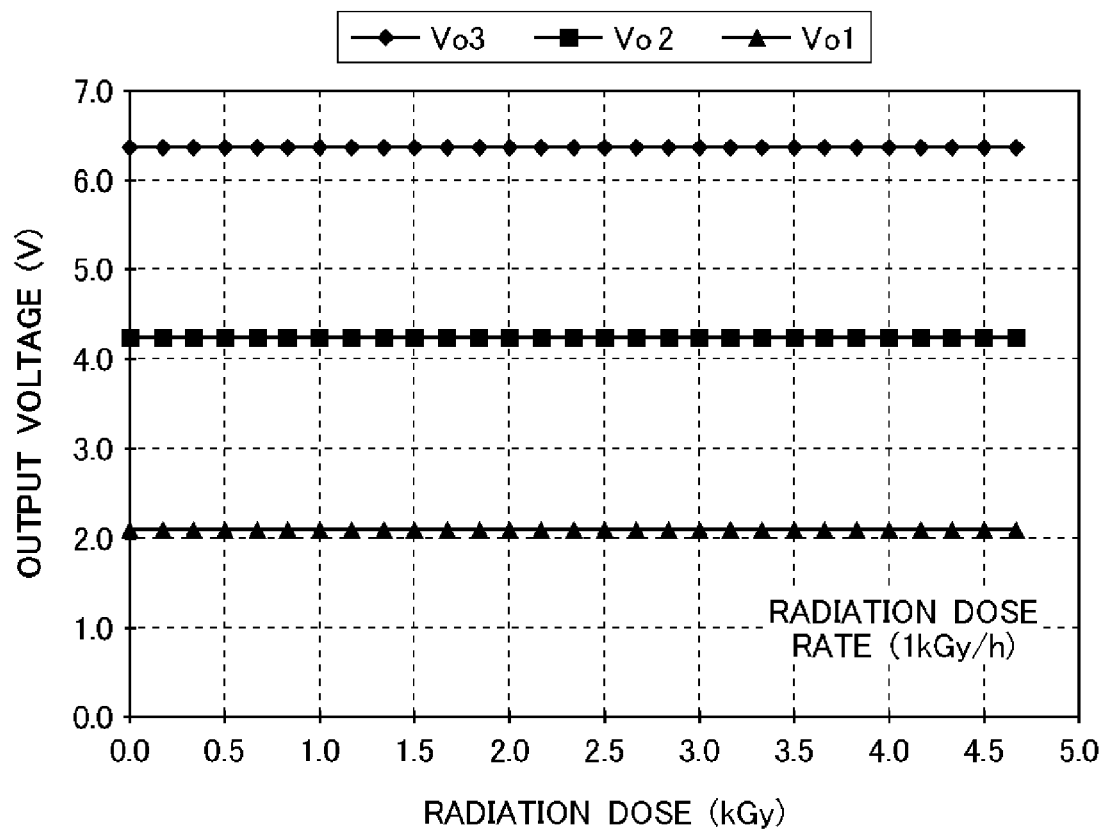
FIG. 3 is a graph describing an exemplary operation of the constant-voltage circuit 10 in a case where a desired voltage is generated with three constant-voltage circuits 10.

FIG. 3 is a graph describing an exemplary operation of three constant-voltage circuits 10 connected in series. As in FIG. 2, FIG. 3 also shows fluctuations of the output voltages Vo relative to radiation dose when the constant-voltage circuits 10 are exposed to the γ-ray atmosphere at a 1 kGy/h radiation dose rate. In FIG. 3, the output voltage of the constant-voltage circuit 10 at the first stage is Vo1, the output voltage of the constant-voltage circuit 10 at the second stage is Vo2, and the output voltage of the constant-voltage circuit 10 at the third stage is Vo3. Note that output voltages of the constant-voltage circuits 10 of the preceding stages are applied to the negative-side power supply nodes 12 in the respective constant-voltage circuits 10. Therefore, the voltage between the positive-side power supply node 14 and the negative-side power supply node 12 in the constant-voltage circuit 10 at the second stage is Vo2−Vo1, and the voltage between the positive-side power supply node 14 and the negative-side power supply node 12 in the constant-voltage circuit 10 at the third stage is Vo3−Vo2.

Each of the control units 20 of the present example controls its corresponding constant-voltage circuit 10 such that the applied voltage between the positive-side power supply node 14 and the negative-side power supply node 12 in the corresponding constant-voltage circuit 10 becomes approximately equal to that in any one of the other constant-voltage circuits 10. In the present example, 'voltages are approximately equal' refers to that the difference of voltages in a normal state, which is not the radiation environment, is 5% or less. Because of this, the applied voltage in a single constant-voltage circuit 10 can be minimized.

In the example of FIG. 3, the output voltage Vo3 is about 6.4 V. With the three constant-voltage circuits 10 connected in series, the voltage loaded on the individual constant-voltage circuit 10 can be lowered even if the output voltage Vo3 is set to be about 6.4 V. In the present example, the voltage loaded on the individual constant-voltage circuit 10 is about 2.1 V. Therefore, the fluctuation of the output voltage of the constant-voltage circuit 10 can be suppressed even if the radiation dose to the constant-voltage circuit 10 increases.

It is preferable that in a case where each of the constant-voltage circuits 10 is exposed to the γ-ray atmosphere such that the radiation dose becomes 2 kGy or more, the voltage between the positive-side power supply node 14 and the negative-side power supply node 12 in each of the constant-voltage circuits 10 is set such that the fluctuation of the voltage between the positive-side power supply node 14 and the negative-side power supply node 12 becomes 1% or less. The fluctuation of the voltage between the positive-side power supply node 14 and the negative-side power supply node 12 may also be 1% or less within a range from 2 kGy to 50 kGy radiation dose.

Also, the voltage between the positive-side power supply node 14 and the negative-side power supply node 12 may be set such that the fluctuation of the voltage between the positive-side power supply node 14 and the negative-side power supply node 12 is 1% or less in a case where each of the constant-voltage circuits 10 is exposed to the γ-ray atmosphere at 1 kGy/h radiation dose rate for two hours or longer. The fluctuation of the voltage between the positive-side power supply node 14 and the negative-side power supply node 12 may also be 1% or less when the exposure time is set within a range from 2 to 50 hours.

An electric field is applied to the semiconductor element included in the constant-voltage circuit 10 to the extent that the characteristic thereof does not fluctuate even if it is exposed to the above-described condition of the radiation dose. The electric field applied to the semiconductor element is determined by the applied voltage between the positive-side power supply node 14 and the negative-side power supply node 12 in the constant-voltage circuit 10. The applied voltage in each of the constant-voltage circuits 10 can be adjusted by changing the number of stages of the constant-voltage circuits 10. That is, the constant-voltage generating apparatus 100 includes the constant-voltage circuits 10 with the number of stages that can meet the above-described characteristic.

Each of the control units 20 may also control its corresponding constant-voltage circuit 10 such that the applied voltage between the positive-side power supply node 14 and the negative-side power supply node 12 in the corresponding constant-voltage circuit 10 becomes different from the applied voltage in any one of the other constant-voltage circuits 10. For example, the applied voltage in any one of the constant-voltage circuits 10 may be 1.2 times or 1.5 times the applied voltage in any other constant-voltage circuit 10 or higher.

However, the applied voltage in each of the constant-voltage circuits 10 is set such that the fluctuation of the output voltage in each of the constant-voltage circuits 10 is 1% or less even if the constant-voltage circuit 10 is exposed to radiations under the above-described condition. Because of this, the degree of freedom in setting each of the output voltages Vo can be enhanced. In the examples of FIG. 1A and FIG. 1B, only the output voltage Vo3 of the constant-voltage circuit 10 at the last stage is output to the outside. Yet, in another example, the output voltages of two or more constant-voltage circuits 10 may be output to the outside.

Figure 4A:
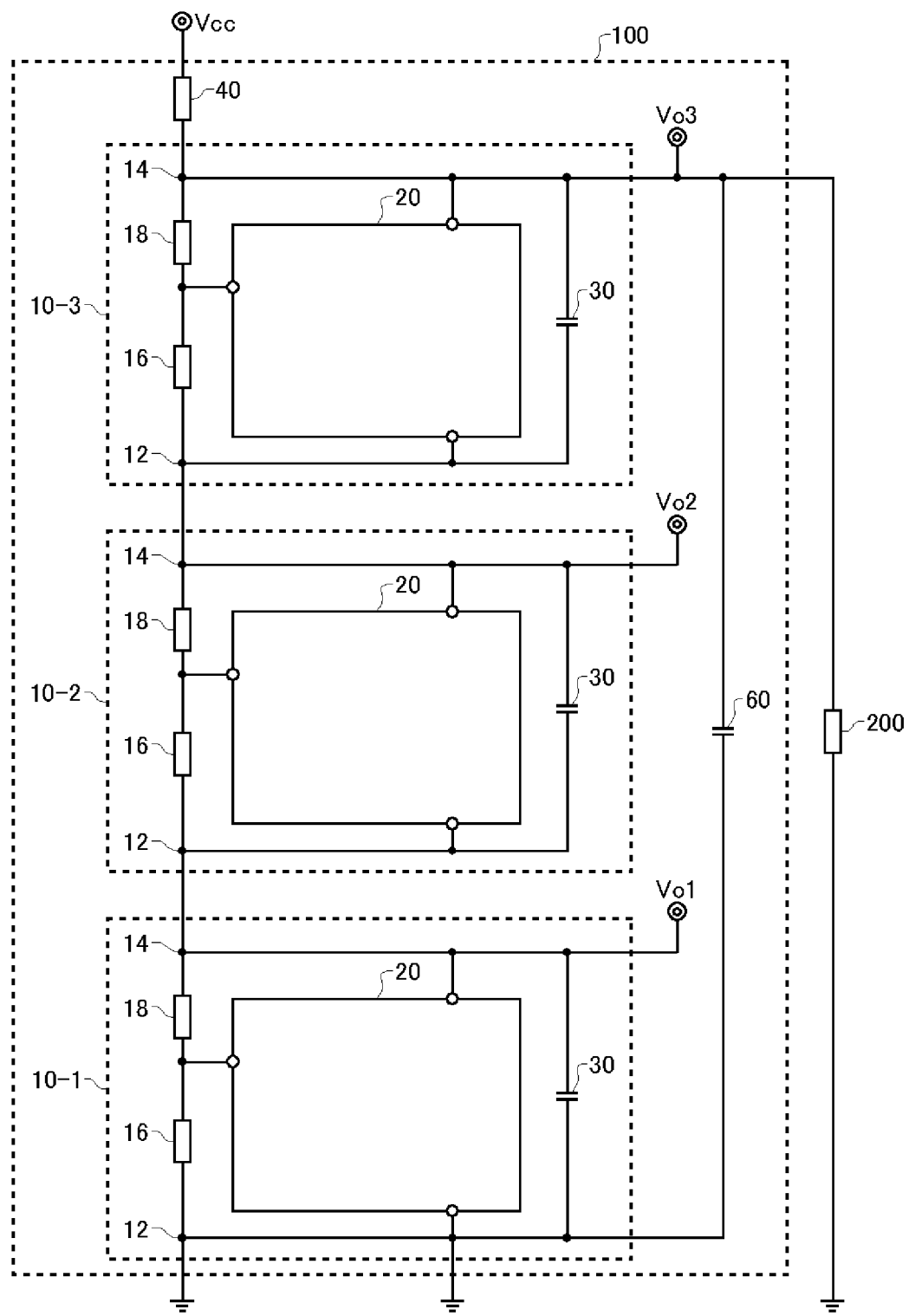
FIG. 4A is a diagram showing another exemplary constant-voltage generating apparatus 100.
Figure 4B:
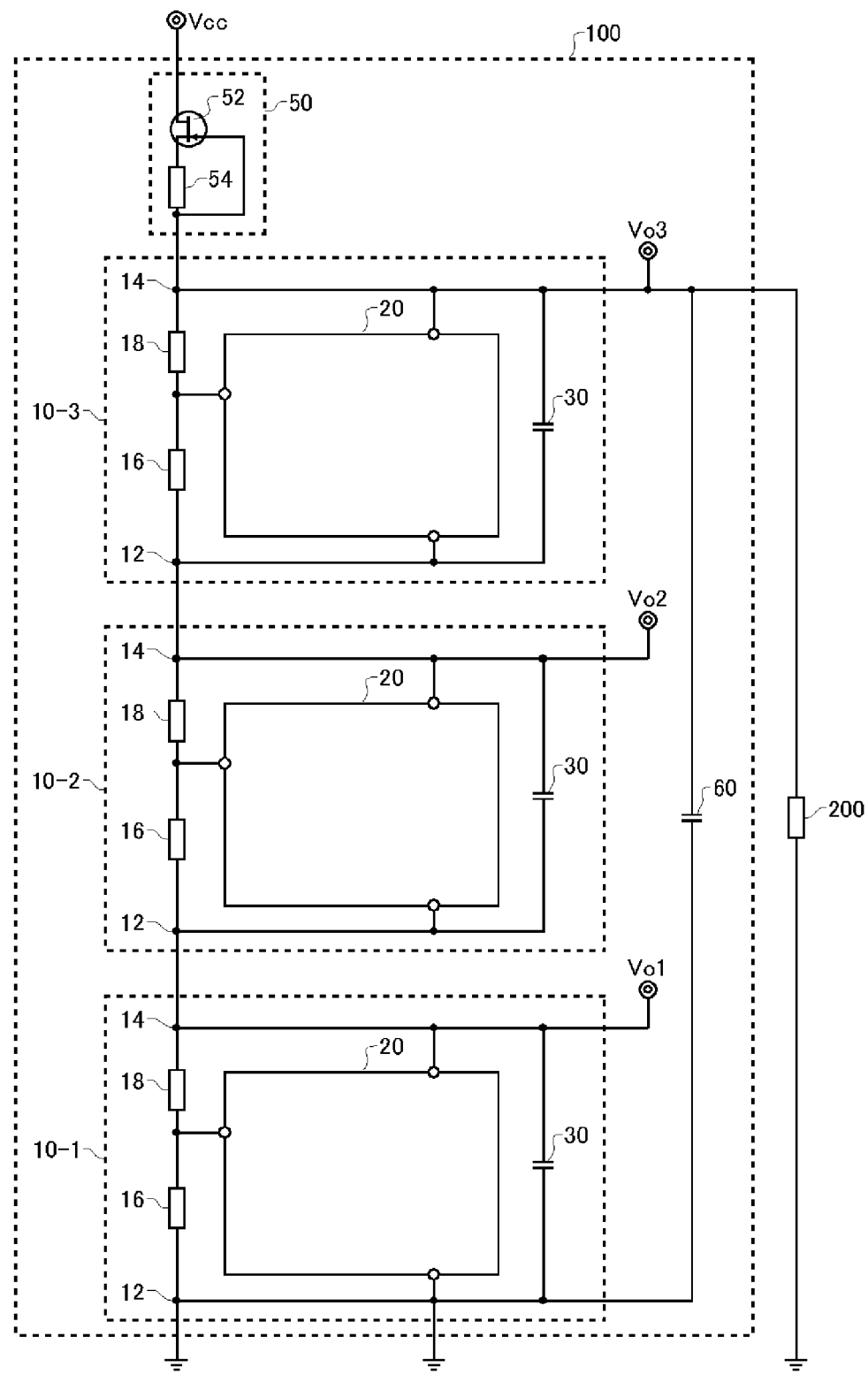
FIG. 4B is a diagram showing another exemplary constant-voltage generating apparatus 100.

FIG. 4A is a diagram showing another exemplary constant-voltage generating apparatus 100. The constant-voltage generating apparatus 100 of the present example further includes a shared capacitor 60, compared to the configuration of the constant-voltage generating apparatus 100 shown in FIG. 1A. The shared capacitor 60 is provided between the positive-side power supply node 14 in the constant-voltage circuit 10 provided at the last stage and the negative-side power supply node 12 in the constant-voltage circuit 10 provided at the first stage. That is, the shared capacitor 60 is provided in parallel with the load 200. FIG. 4B is a diagram showing another exemplary constant-voltage generating apparatus 100. The constant-voltage generating apparatus 100 of the present example further includes the shared capacitor 60, compared to the configuration of the constant-voltage generating apparatus 100 shown in FIG. 1B.

By providing the shared capacitor 60, the output voltage to be applied to the load 200 can be further smoothed. The capacity of the shared capacitor 60 may be the same as the capacity of the smoothing capacitor 30.

Figure 5:
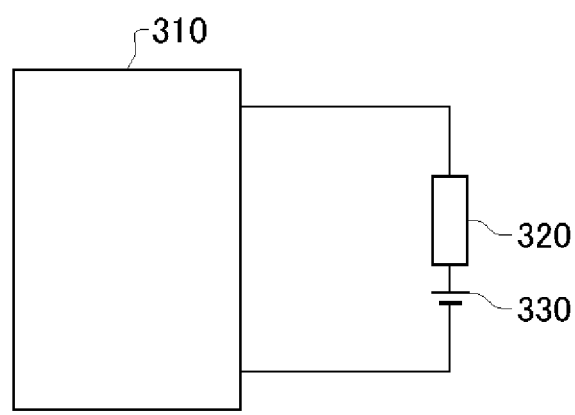
FIG. 5 is a diagram showing an exemplary measuring apparatus 300.

FIG. 5 is a diagram showing an exemplary measuring apparatus 300. The measuring apparatus 300 includes a conversion unit 310, a reception resistor 320, and a DC power supply 330. The measuring apparatus 300 measures physical quantities in facilities in the radiation environment. The physical quantities may also be electrical physical quantities such as voltage or non-electrical physical quantities such as pressure.

The measuring apparatus 300 of the present example has a two-wire type circuit in which the conversion unit 310, the reception resistor 320, and the DC power supply 330 are provided in a loop. The conversion unit 310 generates current signals corresponding to the physical quantity of a measurement target to pass them to the loop circuit. The load 200 described in FIG. 1A through FIG. 4B may be a sensor that measures the physical quantity. The reception resistor 320 is an input resistor of a receiver that receives the current signals.

In the conversion unit 310, any one of the constant-voltage generating apparatuses 100 described in FIG. 1A through FIG. 4B is provided. The conversion unit 310 operates based on constant voltage generated by the constant-voltage generating apparatus 100.

In the measuring apparatus 300, the current value of a current signal that flows when the value of the physical quantity of the measurement target is 0% is greater than 0 A. For example, when the value of the physical quantity of the measurement target fluctuates in a rage from 0% to 100%, the current value of the current signal fluctuates in a range from 4 mA to 20 mA. 4 mA current, which is a current value corresponding to when the value of the physical quantity at the measurement target is 0%, serves as a driving current to drive the conversion unit 310. It is configured that at least 4 mA or greater current flows all the time, and therefore, equipment malfunctions such as disconnection can be identified.

Therefore, the constant-voltage generating apparatus 100 used in the conversion unit 310 is required to operate with a constant current equal to or smaller than 4 mA, for example. This similarly applies to a case where the voltage value of the DC power supply 330 fluctuates.

The constant-voltage generating apparatus 100 with the constant-current circuit 50 provided therein can regulate the current consumption consumed by the constant-voltage generating apparatus 100 even in a case where the power supply voltage Vcc applied from the DC power supply 330 fluctuates.

According to the above described constant-voltage generating apparatus 100, connecting the plurality of constant-voltage circuits 10 in series can reduce voltage generated by the individual constant-voltage circuit 10. Because of this, the fluctuation in the characteristic due to entry of radiations can be suppressed in the semiconductor element included in the constant-voltage circuit 10. Thus, in the constant-voltage generating apparatus 100, generation of high output voltages and resistance to radiations can be easily achieved without use of radiation attenuating material or the like. Also, by providing the constant-current circuit 50, the constant-voltage generating apparatus 100 can operate with a constant current consumption even in a case where the power supply voltage fluctuates.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

What is claimed is:

1. A constant-voltage generating apparatus comprising a plurality of constant-voltage circuits connected in series, each of the constant-voltage circuits having:
    a positive-side power supply node;
    a negative-side power supply node; and
    a control unit that controls voltage between the positive-side power supply node and the negative-side power supply node to be constant voltage, wherein
    the positive-side power supply node in the constant-voltage circuit at a preceding stage is connected to the negative-side power supply node in the constant-voltage circuit at a subsequent stage, and
    each control unit is configured to determine an applied voltage of the corresponding constant-voltage circuit so that the plurality of constant-voltage circuits connected in series each have 1% or less fluctuation of voltage between the positive-side power supply node and the negative-side power supply node in case of being exposed to a radiation dose of 2 kGy or more in a γ-ray atmosphere.

2. The constant-voltage generating apparatus according to claim 1, further comprising a constant-current circuit that regulates power-supply current flowing through the plurality of constant-voltage circuits to be constant.

3. The constant-voltage generating apparatus according to claim 1, wherein each of the plurality of constant-voltage circuits further has a smoothing capacitor provided between the positive-side power supply node and the negative-side power supply node.

4. The constant-voltage generating apparatus according to claim 3, further comprising a shared capacitor provided between the positive-side power supply node in a last stage of the plurality of constant-voltage circuits connected in series and the negative-side power supply node in a first stage of the plurality of constant-voltage circuits connected in series.

5. The constant-voltage generating apparatus according to claim 1, wherein
    each of the plurality of constant-voltage circuits has two or more voltage dividing resistors provided in series between the positive-side power supply node and the negative-side power supply node, and
    the two or more voltage dividing resistors comprise a first voltage dividing resistor in a preceding stage of the plurality of constant-voltage circuits connected in series with a second voltage dividing resistor in a subsequent stage of the plurality of constant-voltage circuits.

6. The constant-voltage generating apparatus according to claim 5, wherein the control unit has:
    a reference voltage generating unit that generates a reference voltage;

a current path that is provided between the positive-side power supply node and the negative-side power supply node and in parallel with the two or more voltage dividing resistors; and a current amount adjusting unit that controls an amount of current flowing through the current path, based on a result of comparing voltage divided by the two or more voltage dividing resistors and the reference voltage.

7. The constant-voltage generating apparatus according to claim 1, wherein each control unit controls the corresponding one of the plurality of constant-voltage circuits such that voltage between the positive-side power supply node and the negative-side power supply node in the corresponding one of the plurality of constant-voltage circuits becomes approximately equal to voltage between the positive-side power supply node and the negative-side power supply node that in any other one of the plurality of constant-voltage circuits.

8. The constant-voltage generating apparatus according to claim 1, wherein each control unit controls the corresponding one of the plurality of constant-voltage circuits such that voltage between the positive-side power supply node and the negative-side power supply node in the corresponding one of the plurality of constant-voltage circuits is different from voltage between the positive-side power supply node and the negative-side power supply node in any other one of the plurality of constant-voltage circuits.

9. A measuring apparatus comprising the constant-voltage generating apparatus according to claim 1 and measuring physical quantities in facilities in radiation environment.

10. The measuring apparatus according to claim 9, further comprising:

a conversion unit; and a two-wire type circuit in which a DC power supply and a reception resistor are connected in a loop.

* * * * *